US006972517B2

(12) United States Patent
Park

(10) Patent No.: US 6,972,517 B2
(45) Date of Patent: Dec. 6, 2005

(54) ORGANIC ELECTRO LUMINESCENT DISPLAY DEVICE WITH CONTACT HOLE WITHIN INSULATING LAYER

(75) Inventor: Jae-Yong Park, Gyeonggi-Do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/608,472

(22) Filed: Jun. 30, 2003

(65) Prior Publication Data

US 2004/0027058 A1 Feb. 12, 2004

(30) Foreign Application Priority Data

Aug. 8, 2002 (KR) .................. 10-2002-0046865

(51) Int. Cl.[7] .......................... H01J 1/62; H01J 63/04
(52) U.S. Cl. ..................... 313/504; 313/502; 313/506
(58) Field of Search ................. 313/504, 499, 313/500, 502, 506; 257/79, 81, 83, 86

(56) References Cited

U.S. PATENT DOCUMENTS 6,525,704 B1 * 2/2003 Kondo et al. .................. 345/78
6,758,538 B2 * 7/2004 Fujita et al. ................. 313/506

* cited by examiner

Primary Examiner—Joseph Williams
Assistant Examiner—Kevin Quarterman
(74) Attorney, Agent, or Firm—Morgan, Lewis & Bockius LLP

(57) ABSTRACT

An organic electro luminescent (EL) display device includes a substrate composed of an array unit and a ground unit; an organic luminescent unit in the array unit and having an organic emitting layer, a first electrode and a second electrode; a ground line in the ground unit directly contacted to the second electrode of the organic luminescent unit; and an insulating layer on the organic emitting layer and exposing a part of the ground line such that the second electrode is directly connected to the ground line.

8 Claims, 7 Drawing Sheets

ORGANIC ELECTRO LUMINESCENT DISPLAY DEVICE WITH CONTACT HOLE WITHIN INSULATING LAYER

The present invention claims the benefit of Korea Patent Application No. 2002-46865 filed in Korea on Aug. 8, 2002, which is hereby incorporated by reference.

BACKGROUND OF THE INVENTION

1. Field of the Invention

The present invention relates to an organic electro luminescent (EL) display device and particularly, to an organic electro luminescent display device which prevents a picture quality from being deteriorated.

2. Description of the Related Art

As an information society of high technology is realized through development of information communications using a computer, display devices are typically used to convey information. A cathode ray tube (CRT), which makes a fluorescent body luminous as result of electrons being emitted from an electron gun, such as in a television, can be used as a display in a desk top computer. About one hundred million cathode ray tubes are produced per a year for such purposes. A liquid crystal display (LCD) device used for a notebook computer can also be used for a computer monitor. Unlike the CRT, an LCD can be used as a monitor on a digital camera. The LCD is not a light emitting device. Rather, an LCD realizes a picture by using light from a back light. However, the CRT and EL device are light emitting types of devices. EL type of devices can be divided into an organic EL type and an inorganic EL type according to the type of fluorescent compound used.

Inorganic EL devices can be divided into a dispersion type and a thin film type, which are all fast since electrons in the fluorescent body are subject to high electric fields. Accordingly, emission is generated at the center of the fluorescent body where collisions between electron and holes occur. Inorganic EL devices are operated using alternating current. The brightness of an inorganic EL device is dependent on voltage and frequency of the alternating current. In contrast, the organic EL emits light by re-combination energy of the electrons and the holes that are injected from the outside.

When used as a display, the organic EL device has a wider viewing angle, a higher contrast, and more excellent visibility than the LCD device since the organic EL device is a light emitting type device. Also, the organic EL device can be fabricated thinly and lightly, since the back light is not required. The organic EL device has such a fast responsiveness that a moving picture can be realized with low voltage direct current driving. Nowadays, the organic EL device is in the spotlight for IMT-2000 display. The organic EL device has a wider usable temperature range. Further, the organic EL devise has a strong vibration resistance because it is completely solid. The organic EL device is power efficient because it has to send current only to pixels requiring emission. Accordingly, when compared with the LCD which has to have a back light turned on across the entire display, the organic EL device is excellent in power efficiency regardless of display contents.

The organic EL display device has a cathode electrode and an anode electrode facing to each other on a transparent substrate, such as glass. A light is emitted from an organic emitting layer as a result of a voltage applied between the cathode electrode and the anode electrode. The anode electrode is formed of indium-tin-oxide (ITO), which has excellent conductivity and light transmittance so that light emitted from the organic emitting layer can be transmitted and hole can be readily supplied. The cathode electrode is formed by a metal having a low work function so that electrons can be readily supplied. Accordingly, if (+) voltage and (−) voltage are respectively applied to the anode electrode and the cathode electrode, the holes injected from the anode electrode and the electrons injected from the cathode electrode are recombined in the organic emitting layer to thereby emit light.

An organic luminescent device has unit pixels arranged in a matrix and drives the organic emitting layer of the unit pixels selectively through a thin film transistors respectively provided at each unit pixel to thereby display an image. FIG. 1 is a plan view of an organic EL display device. As shown in FIG. 1, the organic EL display device 1 comprises an injection signal input unit 2 for applying a gate signal to each pixel, a data signal input unit 3 for applying a data signal, a power input unit 5 for applying a predetermined voltage to a driving thin film transistor, an array unit 9 where an actual emitting is performed, a cathode electrode 8 of an organic luminescent device formed on an entire surface of the array unit 9, and a ground line 7 connected to the cathode electrode 8 through a ground contact hole 6. Also, although not shown, an insulating layer of LiF or $LiO_2$ having the same pattern with the cathode electrode 8 is formed under the cathode electrode 8 so as to inject electron from the cathode electrode smoothly.

An insulating layer (not shown) is formed between the cathode electrode 8 and the ground line 7. The cathode electrode 8 is formed by a vacuum evaporator, thereby having porous films, weak hardness, and poor electric characteristics. The ground line 7 is a low resistance wiring film formed by a sputtering method. Since the cathode electrode 8 and the ground line 7 are not formed at the same time, the cathode electrode 8 and the ground line 7 are connected through the ground contact hole 6 formed on the insulating layer.

FIG. 2 is a sectional view taken along line I—I of FIG. 1. As shown in FIG. 1, the ground line 7 is formed on a first insulating layer 37a, which is formed on a transparent substrate 38. The ground line 7 is connected to the $LiF/LiO_2$ layer 4 and the cathode electrode 8 through the ground contact hole 6 formed on a second insulating layer 37b. Since the cathode electrode 8 and the $LiF/LiO_2$ layer 4 are formed using the same mask, the $LiF/LiO_2$ layer 4 is also formed at a region of the ground contact hole 6 of the ground line 7. Since the $LiF/LiO_2$ layer 4 is non-conductive, there is resistance between the cathode electrode 8 and the ground line 7, which causes a picture quality to deteriorate.

SUMMARY OF THE INVENTION

Accordingly, the present invention is directed to a an organic electro luminescent (EL) display device and a method of manufacturing thereof that substantially obviate one or more of the problems due to limitations and disadvantages of the related art.

Therefore, an object of the present invention is to provide an organic EL display device and a fabrication method thereof, which can prevent a picture quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the object of the present invention, as embodied and broadly described herein, there is provided an organic EL display device comprising a substrate composed of an array unit and a ground unit; an organic luminescent unit in the array unit and having an organic emitting layer, a first electrode, and a second electrode; a ground line in the ground unit and contacted to the second electrode of the organic luminescent unit; and an insulating layer exposing a part of the ground line such that the second electrode is directly connected to the second electrode.

To achieve the object of the present invention, as embodied and broadly described herein, there is provided an method for fabricating organic EL display device comprising: forming an insulating layer on an entire surface of the substrate; forming a thin film transistor (TFT) including an active layer, a gate electrode, and source/drain electrodes on the insulating layer; forming a storage capacitor including an interlayer, a storage lower electrode, and a power line, the storage lower electrode and the power line being formed on and under the interlayer, respectively; forming a ground line on the insulating layer; forming a passivation film which exposes a part of the drain electrode or the source electrode on the TFT and the storage capacitor; forming a first electrode of an organic luminescent device electrically connected to the drain electrode or the source electrode, and then forming a hole injection layer, a hole transport layer, an emitting layer, and an electron transport layer thereon; forming a second electrode over the at least one of a LiF and $LiO_2$ layer and an entire surface of the substrate such that the second electrode is directly connected to the ground line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
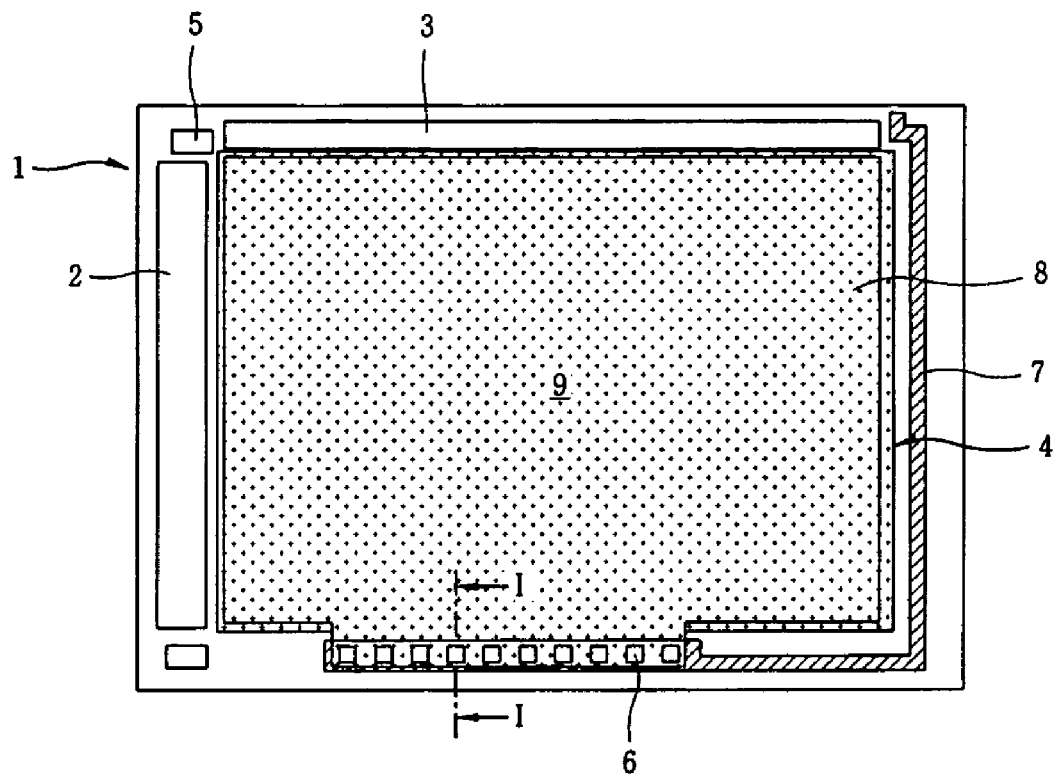
FIG. 1 is a schematic plan view showing an organic EL display device of the related art.
Figure 2:
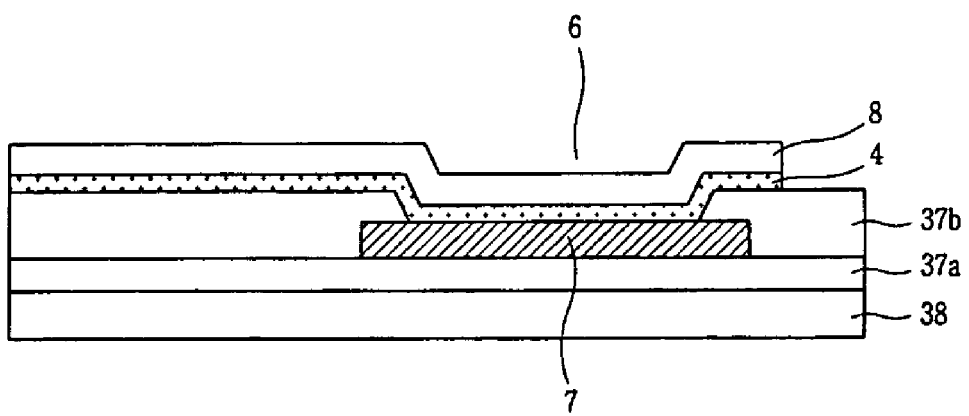
FIG. 2 is a sectional view taken along line I—I of FIG. 1.
Figure 3:
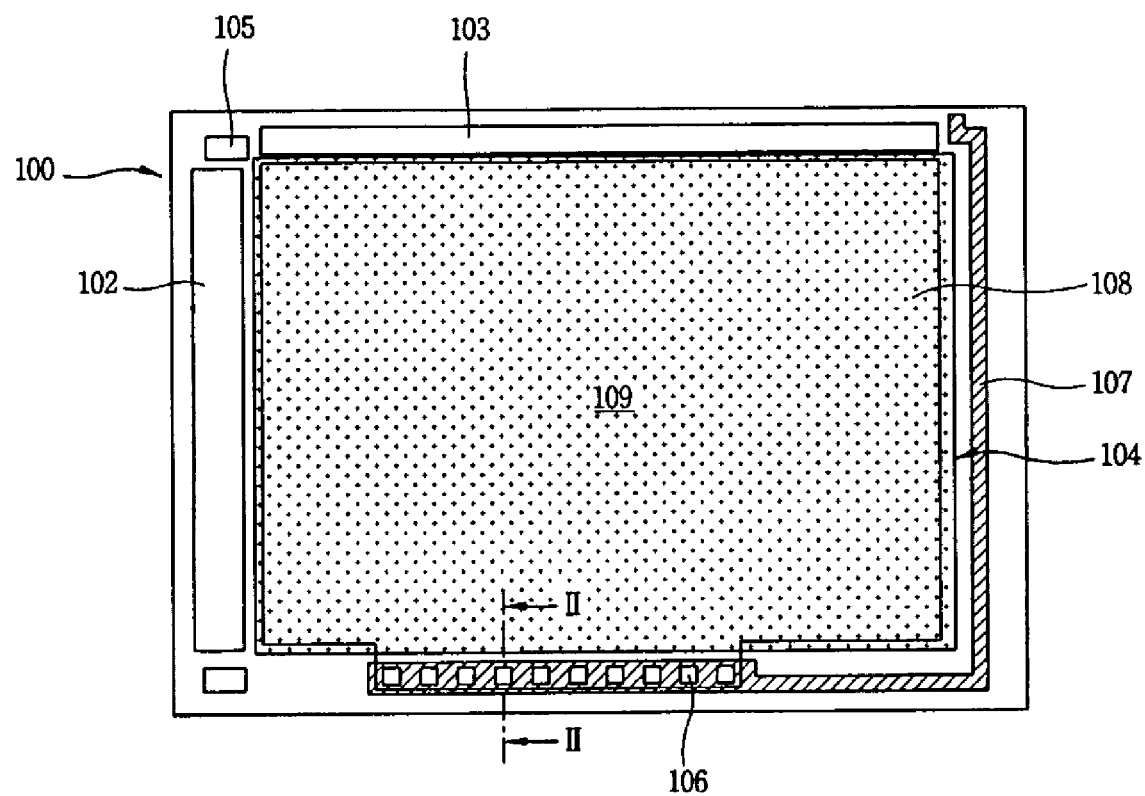
FIG. 3 is a plan view showing an organic EL display device according an embodiment of the present invention.

FIG. 3 is a plan view showing an organic EL display device according to an embodiment of the present invention. As shown in FIG. 3, the organic EL display device according to the present embodiment includes: an injection signal input unit 102 for applying a gate signal to each pixel; a data signal input unit 103 for applying a data signal; a power input unit 105 for applying a predetermined voltage to a driving thin film transistor; an array unit 109 where an actual emitting is performed. In addition, the organic EL display device includes: a cathode electrode 108 of an organic luminescent device (not shown) formed on an entire surface of the array unit 109; a ground line 107 connected to the cathode electrode 108 through a ground contact hole 106; and LiF or $LiO_2$ layer 104 formed under the cathode electrode 108 except a region where the ground line 107 is overlapped with the cathode electrode 108.

As also shown in FIG. 3, an insulating layer (not shown) is formed between the cathode electrode 108 and the ground line 107. Further, the cathode electrode 108 is directly connected to the ground line 107 by the ground contact hole 106. Furthermore, a unit pixel is arranged as a matrix form in the array unit 109, and a TFT for driving, a TFT for switching, and an organic luminescent device are formed at the respective pixels.

Figure 4:
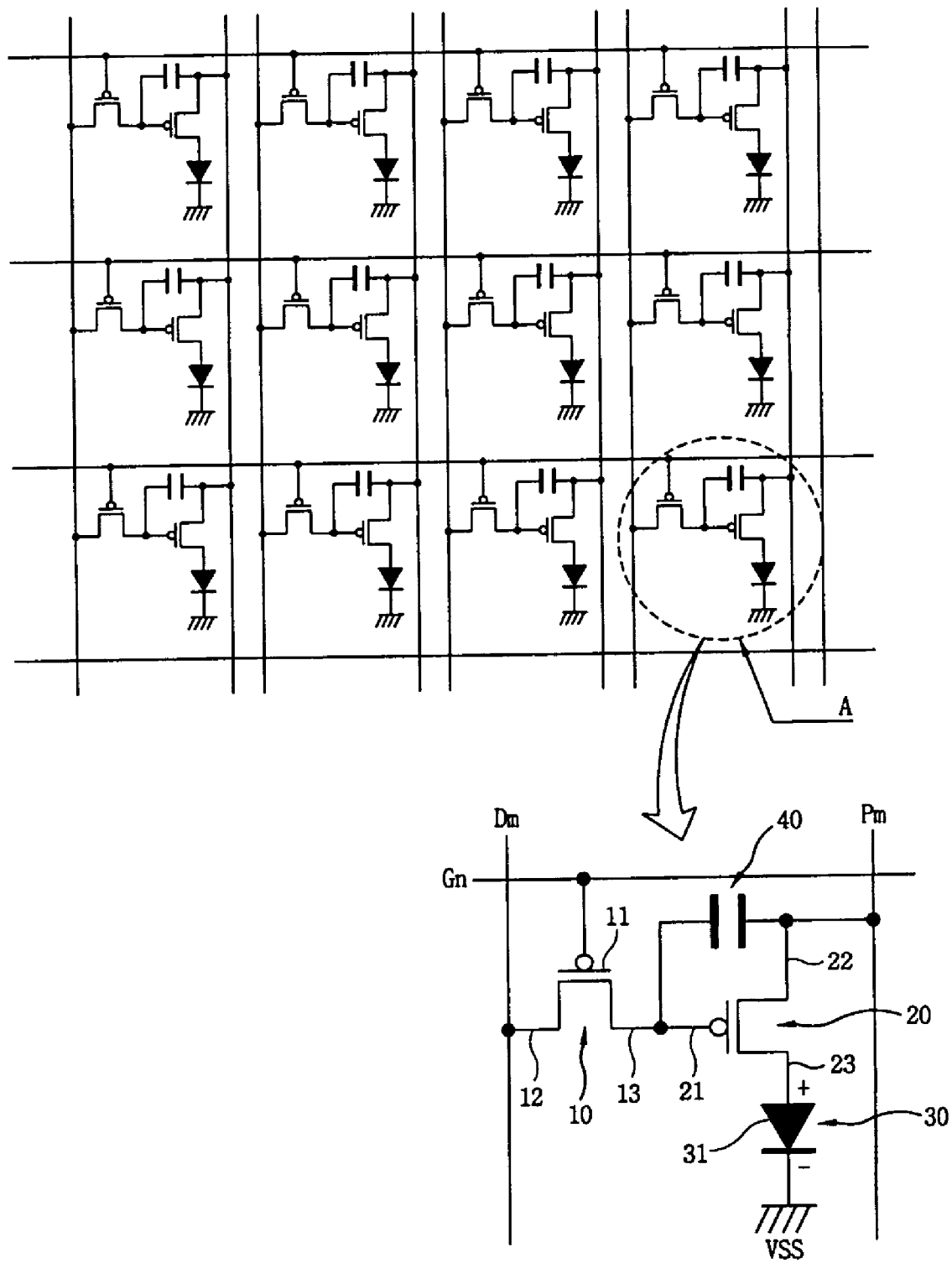
FIG. 4 is an equivalent circuit diagram of an array unit in which each unit pixel is arranged in a matrix.

FIG. 4 is an equivalent circuit diagram of an array unit in which unit pixels are arranged in a matrix. As shown in FIG. 4, in the enlarged region A of FIG. 4, the unit pixel arranged in the array unit 109 is provided with first and second TFTs 10 and 20 at a region formed by a gate line Gn of $n^{th}$ line for supplying a gate signal, a data line Dm of $m^{th}$ line for applying a data signal, and a power line Pm of $m^{th}$ line connected to the power input unit for applying a power voltage. The gate line Gn and the data line Dm are perpendicular to each other, and an organic luminescence device 30 and the first and second TFTs 10 and 20 for driving the organic luminescent device 30 are formed near an intersection point between the gate line Gn and the data line Dm.

The first TFT 10 is composed of a gate electrode 11 connected to the gate line Gn, a source electrode 12 connected to the data line Dm for receiving the data signal, and a drain electrode 13 connected to the gate electrode 21 of the second TFT 20. The first TFT 10 is for switching the organic luminescent device 30. The second TFT 20 is composed of a gate electrode 21 connected to the drain electrode 13 of the first TFT 10, a drain electrode 23 connected to an anode (+) of the organic luminescent device 30, and a source electrode 22 connected to the power line Pm. The second TFT 20 is for driving the organic luminescent device 30. A capacitor 40 is composed of a first electrode connected to the power line Pm and a second electrode commonly connected to the drain electrode 13 of the first TFT 10 and the gate electrode 21 of the second TFT 20. The power line Pm is connected to a power voltage supply line (not shown) arranged at an outer skirt of a panel. That is, a power voltage is supplied to each pixel by power supply line Pm derived from said one power voltage supply line.

The organic luminescent device 30 is composed of an anode electrode(+) connected to the drain electrode 23 of the second TFT 20, a cathode electrode(−) connected to the ground line, and an organic emitting layer 31 formed between the anode electrode(+) and the cathode electrode(−). The organic emitting layer 31 includes a hole transport layer, an emitting layer, and an electron transport layer.

Figure 5:
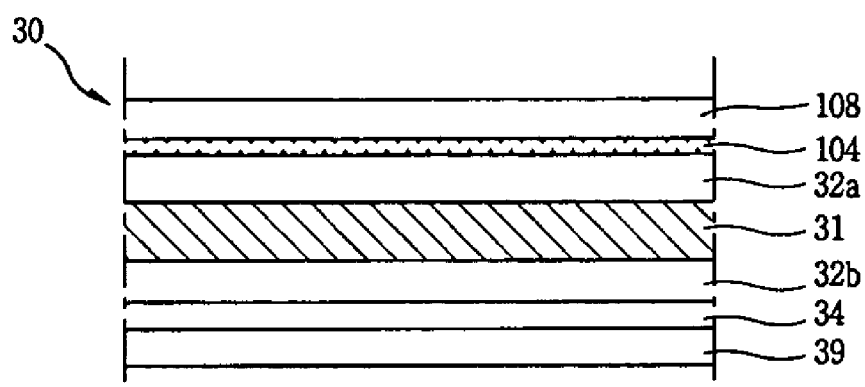
FIG. 5 is a sectional view showing an organic luminescent device in detail.

FIG. 5 is a detail view showing a structure of the organic luminescent device 30. As shown in FIG. 5, the organic luminescent device 30 is composed of an anode electrode 39, a hole injection layer 34 and a hole transport layer 32b formed on the anode electrode 39, an organic emitting layer 31 formed on the hole transport layer 32b, an electron transport layer 32a formed on the organic emitting layer 31, and a cathode electrode 108 formed thereon. A thin film 104 such as LiF or LiO₂ is formed between the cathode electrode 108 and the electron transport layer 32a. The LiF or LiO₂ layer 35 shifts the Fermi level at an interface between the cathode electrode 108 and the electron transport layer 32a, thereby facilitating more electron injection from the cathode electrode 108.

Figure 6:
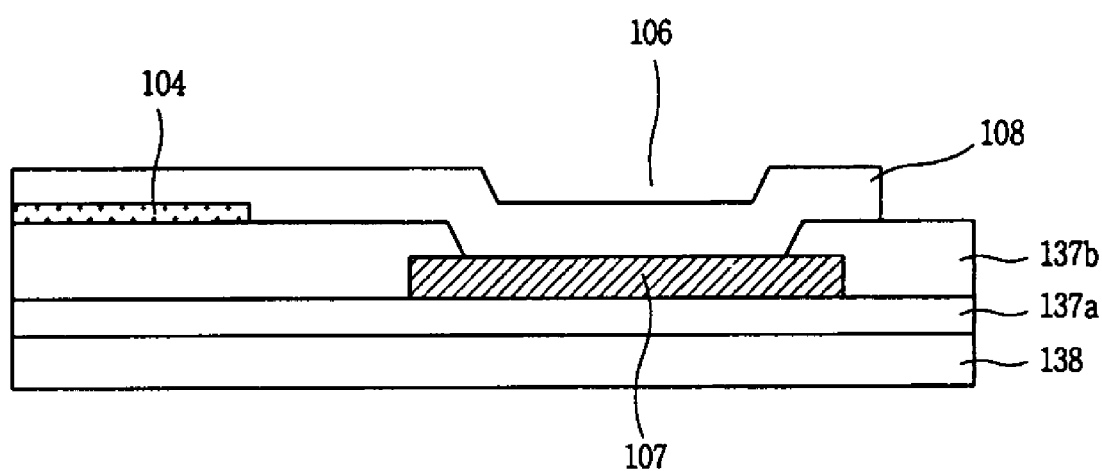
FIG. 6 is a sectional view taken along line II—II of FIG. 3.

FIG. 6 is a sectional view taken along line II—II of FIG. 3. As shown in FIG. 6, the first insulating layer 137a is formed on an entire surface of a transparent substrate 138, and the ground line 107 is formed thereon. The ground line 107 is simultaneously formed at the time when the data line or the gate line is formed. The ground line 107 is also directly connected to the cathode electrode 108 of the organic luminescent device through the ground contact hole 106 formed on the second insulating layer 137b. The thin film 104, such as LiF or LiO₂, is formed between the cathode electrode 108 and the second insulating layer 137b without being overlapped with the ground line 107.

The LiF/LiO₂ layer 104 is formed over an entire surface of the array. The cathode electrode 108 is formed not only on the entire surface of the array but also on the ground line 107 in the opening of the ground contact hole 106 such that the cathode electrode 108 is connected to the ground line 107. Accordingly, the LiF/LiO₂ layer 104 does not play a role as a resistance layer between the cathode electrode 108 and the ground line 107 like in the related art. But rather, the cathode electrode 108 and the ground line 107 are directly contacted such that picture quality is not affected by the LiF/LiO₂ layer 104. In the present embodiment, different masks are respectively used for the LiF/LiO₂ layer and the cathode electrode such that the LiF/LiO₂ layer 104 can be formed without being overlapped with the ground line 107.

A method for fabricating the organic EL display device according to the present invention will be explained with reference to FIGS. 7A to 7F, in which an array region including the TFT, the organic luminescent device, and the capacitor and a connection region between the ground line and the cathode electrode will be explained separately.

Figure 7A:
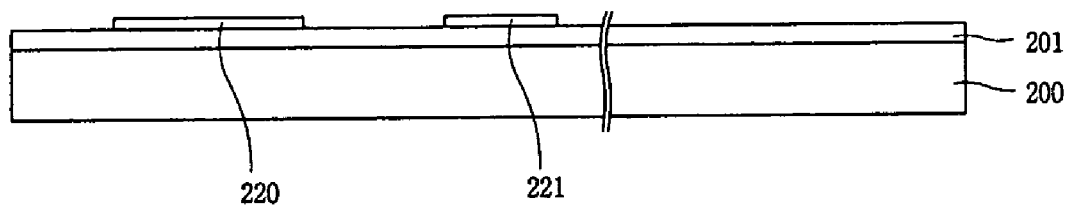
FIGS. 7A to 7F are processing views of an organic EL display device according to an embodiment of the present invention.

First, as shown in FIG. 7A, a silicon oxide film is deposited on an entire surface of a transparent substrate 200, thereby forming a barrier 201. The barrier 201 is formed to prevent impurities of the substrate 200 from entering the TFT, which will be formed later. Then, a semiconductor layer is deposited on the barrier 201 and patterned to thereby form an active layer 220 of the TFT and a lower electrode 221 of the capacitor. The active layer 220 comprised of poly-silicon can be formed by depositing amorphous silicon and then heating the amorphous silicon.

Figure 7B:
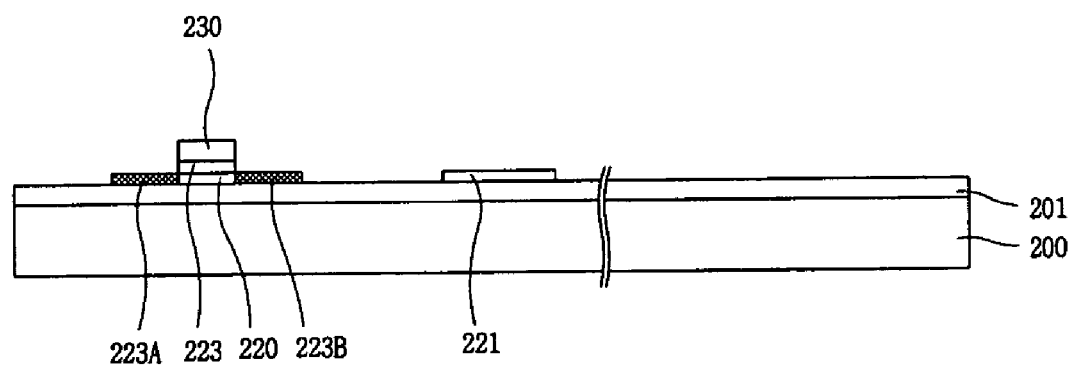

Subsequently, as shown in FIG. 7B, a gate insulating layer 223 is formed at a middle region of the active layer 220, and a metal layer is deposited thereon and patterned, thereby forming a gate electrode 230 of the TFT. At this time, the ground line can also be formed when the gate electrode is formed. Then, impurity ions such as boron (B) are injected into edges of the active layer 220 using the gate electrode 230 of the TFT as a mask to thereby forming a source region 223B and a drain region 223A.

Figure 7C:
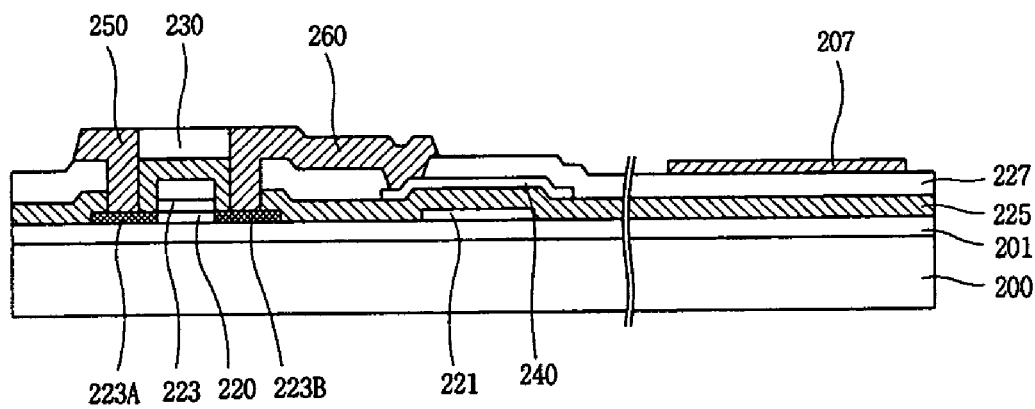

Subsequently, as shown in FIG. 7C, a first interlayer 225 is formed over an entire surface including the gate electrode 230, the source region 223B, the drain region 223A of the TFT, and the lower electrode 221 of the capacitor. Then, a power line 240 is formed on the first interlayer 225 corresponding to the lower electrode 221 of the capacitor, thereby forming a capacitor in which the lower electrode 221 of the capacitor, the first interlayer 225, and the power line 240 are sequentially deposited.

A second interlayer 227 is then formed on an entire surface of the first interlayer 225 including the power line 240, and then the first interlayer 225 and the second interlayer 227 are selectively etched so as to expose a part of the power line 240, source region 223B, and drain region 223A. A drain electrode 250 connected to the drain region 223A and a source electrode 260 connected to both the source region 223B and the power line 240 are then formed. At this time, a ground line 207 is also formed. For example, the source/drain electrodes 260 and 250 and the ground line 207 are formed by a sputtering.

Figure 7D:
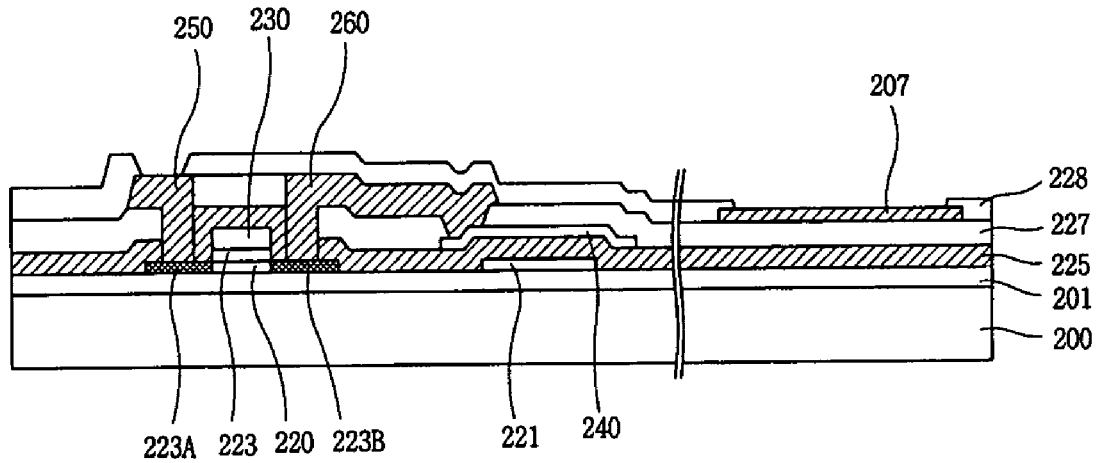
Figure 7E:
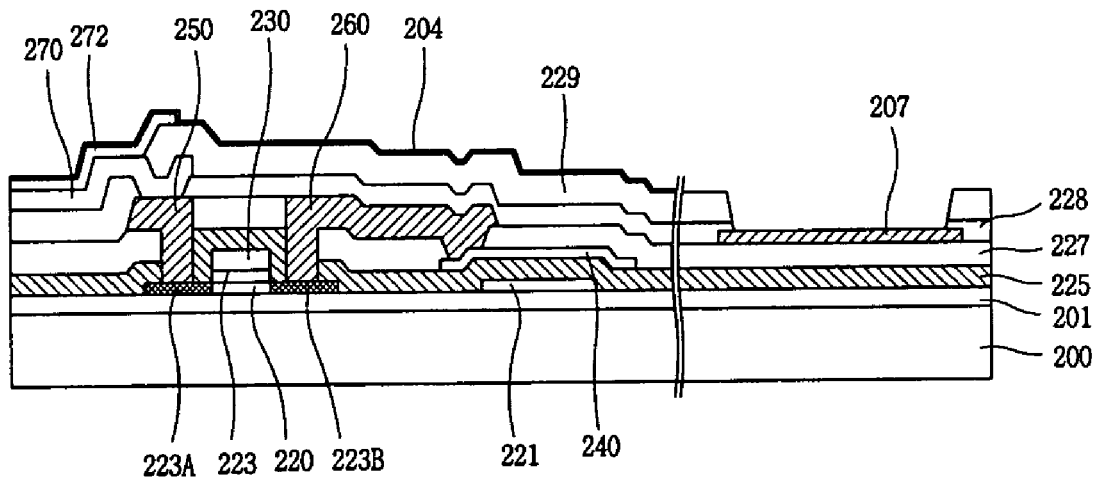

As shown in FIG. 7D, an organic material, such as BCB and acryl, or an inorganic material, such as SiNx and SiOx, are deposited over the source/drain electrodes 260 and 250 and the ground line 207 to form a passivation film 228. The passivation film 228 is then selectively etched so as to expose a part of the drain electrode 250 and the ground line 207. Subsequently, as shown in FIG. 7E, an anode electrode 270 of the organic luminescent device connected to the drain electrode 250 is formed on the passivation film 228, and a third interlayer 229 is formed on the passivation film 228 including the TFT and the capacitor. Then, the hole injection layer, the hole transport layer, the organic emitting layer, and the electron transport layer are sequentially deposited on the anode electrode, thereby forming an organic emitting layer 272. At this time, the anode electrode 270 is preferably formed of a transparent material, such as ITO(indium tin oxide) or IZO(indium zinc oxide).

Figure 7F:
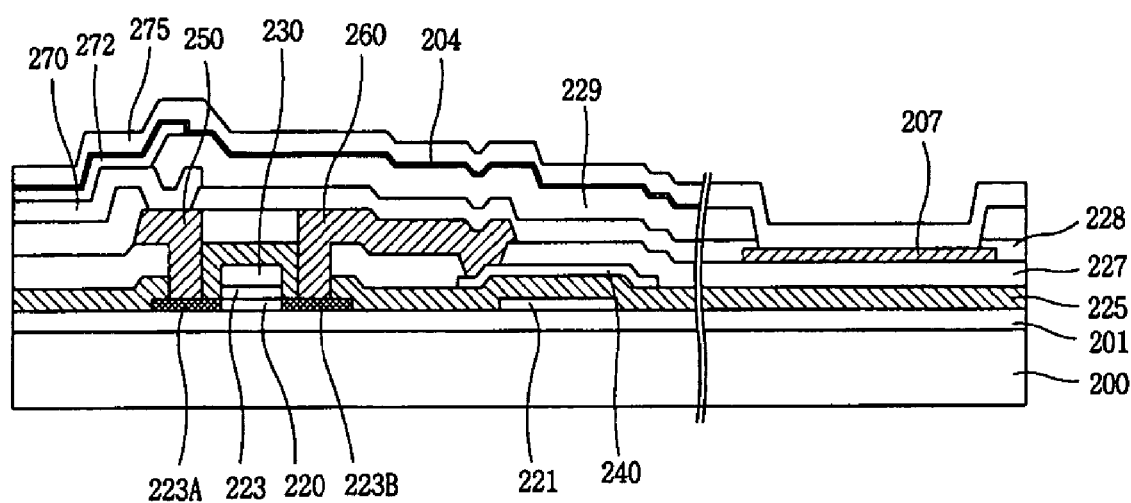

A LiF/LiO₂ layer 204 is thinly formed over the electron transport layer and the substrate. The LiF/LiO₂ layer 204 is formed not to be overlapped with the ground line 207. Subsequently, as shown in FIG. 7F, a cathode electrode 275 of the organic luminescent device directly connected to the ground line 207 is formed on the LiF/LiO₂ layer 204 and the exposed ground line 207. The metal used as the cathode electrode 275 has to be opaque and have excellent light reflectance, such as Al or Al alloy. The cathode electrode 275 can be formed by evaporation.

As mentioned above, in the alternatives, the ground line 207 can be formed at the same time when the source electrode 260 is formed or can be formed at the same time as when either the power line or the gate line are formed. In addition, the gate electrode can be formed at the same time as when the gate line and the injection signal input unit for applying the gate signal are formed. Further, the power line can be formed at the same time as when the power input unit for applying a predetermined voltage to the TFT is formed. Furthermore, the source/drain electrodes can be formed at the same time as when the data line and the data signal input unit for applying the data signal to the data line are formed. As aforementioned, in the present invention, the LiF/LiO₂ layer is not formed between the ground line and the cathode electrode of the organic luminescent device, thereby improving picture quality as compared to the related art.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An organic electro luminescent (EL) display device comprising:
    a substrate having an array unit and a ground unit;
    a first insulating layer in the array unit;
    an organic luminescent unit in the array unit and having a first electrode under the first insulating layer, an organic emitting layer on both the first electrode and the first insulating layer, a second insulating layer on both the organic emitting layer and the first insulating layer, and a second electrode on the second insulating layer;
    a ground line in the ground unit; and
    the second electrode of the organic luminescent unit directly connected to the ground line.

2. The organic EL display device of claim 1, wherein the first electrode is an anode electrode.

3. The organic EL display device of claim 1, wherein the second electrode is a cathode electrode.

4. The organic EL display device of claim 1, wherein the organic emitting layer includes an electron transport layer, an emitting layer, a hole transport layer, and a hole injection layer.

5. The organic EL display device of claim 1, wherein the second insulating layer is formed of at least one of LiF and $LiO_2$.

6. The organic EL display device of claim 1, wherein the second electrode is contacted to the ground line through a ground contact hole formed at the ground line.

7. The organic EL display device of claim 1, wherein the array unit further includes a thin film transistor and a capacitor.

8. The organic EL display device of claim 7, wherein the thin film transistor comprises:
    an active layer including source/drain regions in which impurities are doped with high concentration and a channel region formed at a middle part thereof,
    a gate electrode formed by forming a gate insulating layer on the channel region of the active layer; and
    source and drain electrodes respectively connected to the source and drain regions.

* * * * *